US008751977B2

(12) United States Patent
Blatchford

(10) Patent No.: US 8,751,977 B2
(45) Date of Patent: Jun. 10, 2014

(54) METHOD FOR GENERATING ULTRA-SHORT-RUN-LENGTH DUMMY POLY FEATURES

(75) Inventor: James Walter Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/949,336

(22) Filed: Nov. 18, 2010

(65) Prior Publication Data

US 2012/0131522 A1    May 24, 2012

(51) Int. Cl.
*G06F 17/50* (2006.01)
(52) U.S. Cl.
USPC .............................................. 716/54; 716/55
(58) Field of Classification Search
USPC ..................................................... 716/54, 55
See application file for complete search history.

(56) References Cited

U.S. PATENT DOCUMENTS

| 2007/0099424 | A1 | 5/2007 | Rathsack et al. |
| 2007/0105387 | A1 | 5/2007 | Blatchford et al. |
| 2008/0014684 | A1 | 1/2008 | Blatchford et al. |
| 2008/0166889 | A1 | 7/2008 | Rathsack et al. |
| 2008/0261375 | A1* | 10/2008 | Lucas et al. ................... 438/400 |
| 2009/0300567 | A1 | 12/2009 | Rathsack et al. |
| 2010/0193960 | A1* | 8/2010 | Mashita et al. ............... 257/773 |
| 2011/0062595 | A1* | 3/2011 | Sim et al. ...................... 257/775 |
| 2012/0074400 | A1* | 3/2012 | Shieh et al. ..................... 257/48 |

* cited by examiner

*Primary Examiner* — Suresh Memula
(74) *Attorney, Agent, or Firm* — Alan A. R. Cooper; W. James Brady, III; Frederick J. Telecky, Jr.

(57) ABSTRACT

A method and apparatus for designing a lithography mask set which provides polygon features of a desired size at advanced technology nodes, for example, using live features and dummy features. A dummy feature can be formed within a confined space by specifying an allowable dummy feature length even though the feature length may result in contact between the dummy feature and the live feature. After specifying the dummy feature length, a pattern generation (PG) extract can be performed to pull back the dummy feature away from the live feature by an allowable distance. The PG exact process can result in a shorter dummy feature which has a length which is shorter than can be specified directly by design rules, but which passes rule checking.

7 Claims, 4 Drawing Sheets

METHOD FOR GENERATING ULTRA-SHORT-RUN-LENGTH DUMMY POLY FEATURES

TECHNICAL FIELD

The present teachings relate to the field of integrated circuits and more specifically to methods and structures for designing a mask set including at least one mask using a semiconductor device design layout program, and semiconductor device lithography.

BACKGROUND

Conventional optical projection lithography has been the standard silicon patterning technology in semiconductor manufacturing processes, e.g., in integrated circuits (ICs) fabrication. During the lithographic projection, a mask that includes a semiconductor circuit layout pattern can be imaged onto a substrate that is at least partially covered by a layer of photoresist (i.e., "resist"). Layouts used to create such masks are typically generated using computer-aided design (CAD) programs, sometimes called electronic design automation (EDA). For example, most CAD programs follow a set of predetermined design rules in order to create functional masks.

One goal in IC fabrication is to faithfully reproduce the original circuit design or layout on the wafer using the designed mask. Another goal is to use as much of the wafer real estate as possible. As the size of an IC is reduced and its density increases, however, the critical dimension (CD) of its corresponding mask approaches the resolution limit of the optical exposure tool. For example, transistor matching requirements for advanced technology nodes, such as less than 1.0 μm, require exquisite CD control, beyond the capability of current lithography and etch tools and processes. An important component of variation is matching between gates in the interior of an array of active gates, e.g., over the same active region, and those on the end of the array. For example, for the 45 nm technology node, the printed interior gates may vary from their designed size by a value of X, while the printed end gates might vary from their designed size by a value of 2 to 3 times X.

Dummy polysilicon is often used to reduce feature variation, e.g., for gates at the end of a gate array. In order to avoid dummy gates interfering with the device performance, dummy gates must be formed far away from the active gates. Additionally, to reduce interference of the dummy polysilicon feature on the "live" feature, the dummy feature should be spaced from the live feature by some minimum amount.

SUMMARY OF THE EMBODIMENTS

The following presents a simplified summary in order to provide a basic understanding of some aspects of one or more embodiments of the present teachings.

In a first embodiment of the present teachings, a method for designing a lithography mask set includes providing a device circuit layout including a first polygon portion having a first orientation and a second polygon portion having a second orientation generally perpendicular to the first orientation, wherein the second polygon portion forms a line-end geometry. A separation between the first polygon portion and the second polygon portion is specified to be a first distance, and a separation between the second polygon portion and all other polygons in the device circuit layout is specified to be at least a second distance that is larger than the first distance. A first length for the second polygon portion is specified. A third polygon portion is provided, which has the second orientation and is separated from all other polygons in the device by a third distance that is larger than the first distance and can be at least as large as the second distance. The third polygon portion is specified to have a second length that is at least as long as the first length. The length of the second polygon portion is reduced from the first length to a third length which is less than both the first length and the second length, wherein the third length is based on the second feature's proximity to the first feature.

In another method of the present teachings, a method for designing a lithography mask set includes providing a device circuit layout including a first polygon portion having a first orientation and a second polygon portion having a second orientation generally perpendicular to the first orientation, wherein the second polygon portion forms a line-end geometry. The method further includes specifying that a separation between the first polygon portion and the second polygon portion is equal to a first distance, and that a separation between the second polygon portion and all other polygons in the device is at least a second distance that is larger than the first distance. The method further includes specifying a first length for the second polygon portion, providing a third polygon portion having the second orientation and separated from all other polygons in the device by a third distance that is larger than the first distance and can be at least as large as the second distance, specifying that the third polygon portion has a second length that is at least as long as the first length, and replacing the second polygon portion with a fourth polygon portion with a third length less than the first length based on a proximity of the second feature to the first feature.

In another embodiment, a method for designing a lithography mask set includes providing a device circuit layout including a first polygon portion having a first orientation and a second polygon portion having a second orientation generally perpendicular to the first orientation, wherein the second polygon portion forms a line-end geometry. Further, the method includes specifying a first location for the first polygon portion and a second location for the second polygon portion, wherein the first and second locations result in contact between the first polygon portion and the second polygon portion, specifying that a separation between the second polygon portion and all other polygons in the device circuit layout is a first distance greater than zero, and specifying a first length for the second polygon portion. A third polygon portion is provided, having the second orientation and separated from all other polygons in the device by a second distance that is larger than the first distance. It is specified that the third polygon portion has a second length that is at least as long as the first length. The length of the second polygon portion is reduced from the first length to a third length which is less than both the first length and the second length, wherein the third length is based on the second feature's proximity to the first feature, and results in the second polygon portion being spaced from the first polygon portion by a distance greater than zero.

Another embodiment includes a computer-readable medium storing a set of instructions which causes a computer system to perform a set of instructions to execute a method for designing a lithography mask set. The method includes providing a device circuit layout including a first polygon portion having a first orientation and a second polygon portion having a second orientation generally perpendicular to the first orientation, wherein the second polygon portion forms a line-end geometry. A separation between the first polygon portion and the second polygon portion is specified to be a first distance, and a separation between the second polygon portion and all other polygons in the device circuit layout is specified to be at least a second distance that is larger than the first distance. A first length for the second polygon portion is specified. A third polygon portion is provided, which has the second orientation and is separated from all other polygons in the device by a second distance that is larger than the first distance. The third polygon portion is specified to have a second length that is at least as long as the first length. The length of the second polygon portion is reduced from the first length to a third length which is less than both the first length and the second length, wherein the third length is based on the second feature's proximity to the first feature.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures.

Figure 1:
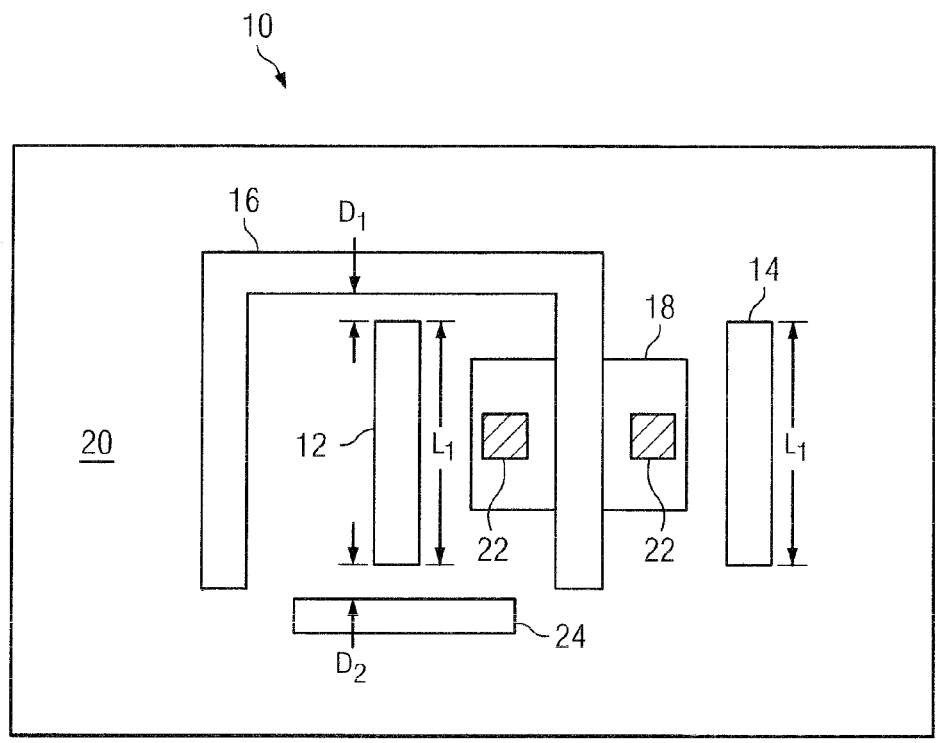
FIG. 1 is a plan view of an exemplary structure which can be formed using an embodiment of the present teachings.

It should be noted that some details of the figures have been simplified and are drawn to facilitate understanding of the inventive embodiments rather than to maintain strict structural accuracy, detail, and scale.

DESCRIPTION OF THE EMBODIMENTS

Reference will now be made in detail to exemplary embodiments of the present teachings, examples of which are illustrated in the accompanying drawings. Wherever possible, the same reference numbers will be used throughout the drawings to refer to the same or like parts.

As used herein, the term "design" refers to geometric shapes (i.e., a plurality of polygons) for a mask layout (i.e., a schematic used to make a semiconductor device) that correspond to mask features formed on a mask or set of masks, and/or features formed in/on the substrate. The mask layout can be used to form a mask set which includes at least one mask. The mask set includes mask features (polygons) that can be used to endow an incoming beam with a patterned cross-section, corresponding to a target pattern that is to be created in/on a target portion of a substrate.

The mask feature can be used to pattern a feature on a substrate. Examples of a semiconductor feature can include a gate, a gate bus, a well, an isolation structure, an interconnect line, a space, a contact hole, a pillar, a resistor, a ghost feature, or any other element of a semiconductor device or other device as will be understood by one of ordinary skill in the art. In various embodiments, a mask feature can include a resolution enhancement technique (RET) design, such as a phase shifter, a sub-resolution assist feature (SRAF), or another optical proximity correction (OPC) technique that assists in forming a feature on the substrate. In an exemplary embodiment, a mask feature can include one or more printable-assist features laid out on a mask design. In various embodiments, multiple mask features can be used to form structures on the substrate. The multiple structures, when finally formed, can combine to form a desired semiconductor feature.

As used herein unless otherwise specified, the term "printable-assist feature" or "dummy feature" refers to an assist feature laid out from IC mask design and used to improve the critical dimension control when forming semiconductor devices by removing or minimizing the differences in optical proximity correction (OPC) and responses to process variations. Unlike ghost features known in the prior art, the "printable-assist features" can be laid out adjacent to or extended from a semiconductor feature and can remain on the produced final substrate/wafer, while ghost features can be initially formed on a substrate but later removed as described in the related U.S. patent application Ser. No. 11/269,633, entitled "Gate Critical Dimension Variation by Use of Ghost Features," and Ser. No. 11/482,041, entitled "Two-Print-Two-Etch Method for Enhancement of CD Control Using Ghost Poly," which are hereby incorporated by references in their entirety.

For example, a "printable-assist feature" can be a "printable-gate-assist feature" formed at the end of a gate array so that the environment at the end of the gate array is similar to the environment in the interior of the gate array. That is, the printable-gate-assist feature can be drawn adjacent to, e.g., a polysilicon gate (i.e., "polygate"). In this case, printable-assist features can be used to reduce the critical dimension variation, such as, for example, for gates at the end of a gate array. In another example, the "printable-assist feature" can be a "printable-gate-extension feature" formed to lengthen gate extensions to match a length of a longer adjacent transistor gate feature.

In various embodiments, printable-assist features can be made of the same material as the other features concurrently formed on a substrate or a wafer. In the case of an array of gates made from a layer of polysilicon, for example, the printable-gate-assist feature can be formed from the same layer of polysilicon. In other instances, however, where the layer is made of another material, such as a metal, a semiconductor, or an insulator, the printable-gate-assist feature or the printable-gate-extension feature can be made of that material.

The disclosed strategic placement of the printable assist features can improve CD control, e.g., for transistor gates. For example, design rules have been established to layout gates in a grid fashion, so that the control of internal gates on active regions can have the same control as external gates at the edge of active. In addition, printable gate-assist feature can enable gates at the edge of cell libraries to have the same control as internal density patterned gates. In an exemplary embodiment, the printable-assist features can be placed (e.g., laid out in the mask layout) on a grid layout over shallow trench isolation (e.g., field oxide) to provide good optical diffraction support to adjacent functional gates on active silicon.

In various embodiments, the design layout can include, for example, placing printable-assist features over a defined pitch range determined by simulation, defining line end extensions that mimic gate line end extensions, and attaching extensions to existing gates to support longer neighboring gates. In various embodiments, the disclosed printable-assist features can remain on the final substrate/wafer and be supported by, e.g., single photo/etch flow as well as double pattern flows where etching other assist feature (e.g., ghost poly) may damage adjacent active silicon in its second etch.

The printable-assist features can provide many advantages. For example, the layout rules can be directly used by design to represent the best lithographic process control of critical transistors. These layout rules can encompass basic lithography principles (e.g., in a grid format) that do not need to be explicitly understood by designers. All designated critical gates can be inherently shielded using these printable assist features by a single photo/etch process, and, alternatively by a double pattern process. Additionally, the printable assist features can be optimized to meet process requirement (e.g., size ups/area rules) after the design layout to provide process/OPC teams flexibility, as compared with other solutions in the prior art, which typically provide support of a few transistor cases post layout.

FIG. 1 depicts a plan view of a portion of a semiconductor device structure 10 which includes the use of dummy features 12, 14 which are designed to function as print-assist features to enhance the formation of one or more live features 16. The live features 16 will be part of a circuit design and will function electrically during operation of the completed device, while dummy features 12, 14 are formed to assist with the formation of the live features 16, but are not intended to function electrically during operation of the completed device.

In the embodiment of FIG. 1, the live feature is a transistor gate 16 which includes two vertically oriented portions connected together with a horizontally oriented portion. It should be noted that the specified orientation refers to the orientation in the FIGS. rather than an orientation on the completed device. The transistor gate 16 thus includes a "turn." Additionally, the transistor gate 16 is formed to directly overlie an active region 18, which can be a doped region within a semiconductor substrate 20 as part of a silicon wafer or silicon wafer portion. The active region 18 may form a transistor source region, a transistor drain region, and a transistor channel region in accordance with conventional transistor design. Contacts 22 can be formed to electrically contact the active region. The formation and use of active regions and active region contacts are well known.

The live features 16 and dummy features 12, 14 can be formed from the same layer, for example, from a layer of doped or undoped polysilicon, a conductive metal layer, a polycide, etc. In the embodiment of FIG. 1, the dummy feature 12 is vertically oriented in a direction which is generally perpendicular to the horizontal portion of transistor gate 16.

During an embodiment to form the structure of FIG. 1, a photoresist layer can be formed over a blanket layer such as a polysilicon layer. One or more patterned masks are used to pattern a light source, for example, using a pattern of transparent, semitransparent, and opaque mask regions which form patterned openings. The light source is patterned by the mask, then the patterned light source illuminates and patterns the photoresist layer.

During the design of masks that pattern the light source which illuminates the photoresist layer, a set of established design rules must followed to define the openings in the mask. In less advanced technology nodes, for example, technology nodes greater than about 65 nm, the openings in the one or more masks which form polysilicon features 12, 14, and 16 can be defined directly. That is, the set of design rules specified by the electronic design automation (EDA) software can specify, for example, a length "$L_1$" for each of the dummy features 12, 14. Additionally, a minimum distance "$D_1$" between the horizontal portion of live feature 16 and dummy feature 12, and a minimum distance "$D_2$" which can be greater than distance "$D_1$" between dummy feature 12 and an adjacent feature 24 can be directly specified and maintained. Additionally, a distance between dummy feature 12 and all other features except feature 16 can be at least equal to "$D_2$". While dummy feature 12 is designed as a print-assist feature and is not designed to be electrically active within the circuit, it can interact with circuit elements to result in unwanted electrical issues such as parasitic capacitance and gate oxide stability if it is electrically connected with the live feature 16.

Less advanced technology nodes allow the dummy features 12, 14 to be specified with a length of $L_1$. However, with more advanced technology nodes (for example, less than about 28 nm), the minimum printable run length for dummy features becomes more restrictive. For 28 nm and smaller technology nodes, the minimum printable run length "L" for a dummy feature such as 12 can be substantially larger than the minimum printable feature width of 28 nm. This can lead to problems during the design of the device layout, particularly in structures where a polysilicon turn is required near the edge of an active region. For example, a minimum printable length for dummy feature 12 may be longer than length "$L_1$" which is required to fit the feature into the available space. In this case, specifying a length "$L_1$" for feature 12 would violate the EDA design rules because a feature with a length of $L_1$ is smaller than the minimum printable feature width.

A method which can be used to design and form a semiconductor structure such as the structure of FIG. 1 at advanced technology nodes, for example, at 28 nm or less, has been developed. The method can use a process which conforms to specified EDA design rules.

Figure 2:
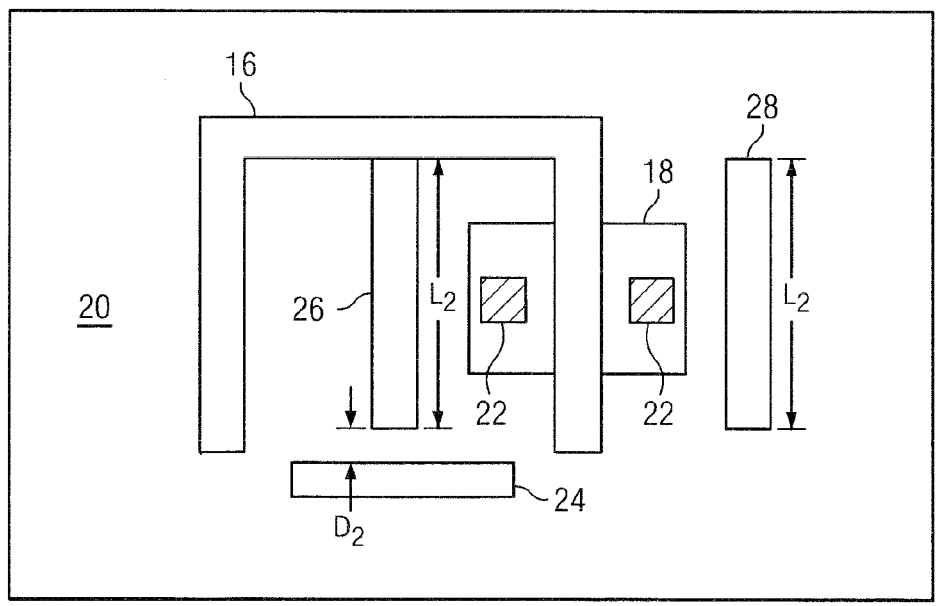
FIGS. 2-4 are plan views of intermediate structure layouts which can be formed using an embodiment of the present teachings.
Figure 3:
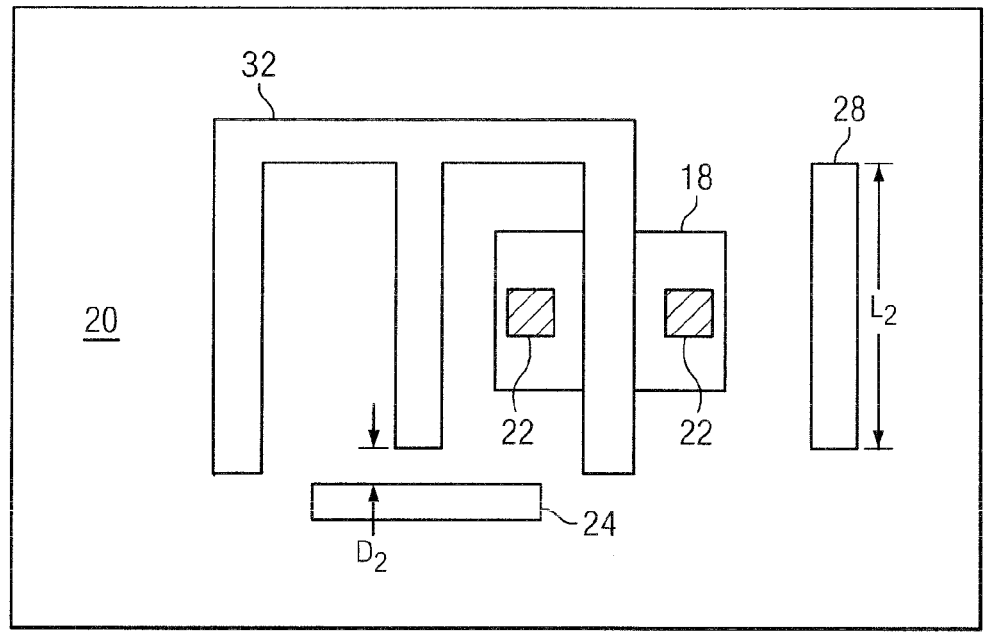

In an embodiment of the present teachings, features (i.e., polygons) such as dummy features 26, 28 of FIG. 2 can be designed to have a length $L_2$ which is at least as long as the minimum printable feature length specified by the design rules for the particular technology node. For example, if a minimum length for dummy feature 26 allowed by the design rules for the particular technology node is 214 nm, the feature can be specified at 214 nm to meet the design rules, even though a length shorter than 214 nm, for example, 144 nm, is desired. However, designing the feature at this minimum length allowed by design rules may result in electrical contact between dummy feature 26 and live feature (i.e., polygon) 16, such that the two features would be formed as a single feature 30 as depicted in FIG. 3. In other words, live feature 16 is placed at a first location and dummy feature 26 is placed at a second location, wherein the first and second locations result in contact between live feature 16 and the dummy feature 12. As discussed above, while dummy feature 26 of FIG. 2 is not designed to be electrically active during operation of the completed circuit, leaving dummy feature 26 (FIG. 2) connected to live feature 16 is not desirable. Feature 28 can be at least the length "$L_2$" (i.e., the length of feature 26) but may be greater than "$L_2$", and is separated from all other features by a minimum separation of $D_2$, where $D_2$ is at least a large as $D_1$. In an embodiment, $D_1$ is less than or equal to 0.9 times $D_2$.

Further, even if forming structure 26 at a minimum printable length $L_2$ does not result in electrical contact between live feature 16 and dummy feature 26, it may not be possible to maintain a minimum distance $D_1$ (FIG. 1), which would violate a design rule.

Figure 4:
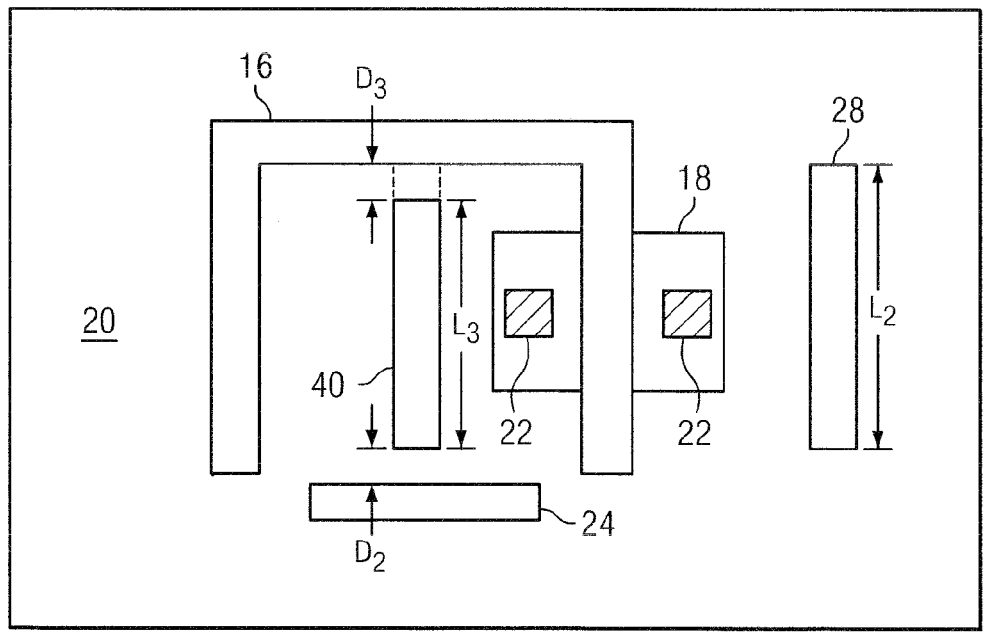

Therefore, after designing the layout such that feature 26 of FIG. 2 meets a minimum allowable run length but connects with live feature 16 as depicted in FIG. 2 (or is in close proximity of live feature 16 and violates a design rule but does not connect with live feature 16), a pattern generation (PG) extract process can be performed to pull back the length of feature 26 to result in the structure of FIG. 4. In the FIG. 4 structure, dummy feature 40 has a length of $L_3$ and a spacing of $D_3$ from feature 16. $L_3$ is shorter than $L_2$, and in an embodiment is less than or equal to 0.7 times $L_2$. Because feature 26 of FIG. 2 is supported by live feature 16 which is in close proximity to feature 26, a PG extract pullback of feature 26 can be controlled to "disconnect" feature 26 from feature 16 to result in dummy feature 40 of FIG. 4.

Feature 40 is a mask design feature which is being manipulated in software and is not actually formed until formation of the mask. Thus the pullback of feature 40 which shortens the feature can also be considered a replacement of feature 40 with a shorter feature.

When a feature such as dummy feature 26 (referring back to FIG. 2) is supported by a crossing structure such as transistor gate 16, a PG extract pullback can be controlled to 70 nm. Initially designing feature 26 to have a length $L_2$ of 214 nm, and then performing a PG extract to pull back feature 26 by 70 nm, for example, can result in a feature 40 of FIG. 4 which has a length $L_3$ of 144 nm. In this embodiment, initially specifying feature 40 to have a run length of 144 nm would violate design rules at the 28 nm and smaller technology nodes. However, specifying feature 40 to have a run length of 214 nm, then pulling the feature back by 70 nm using a PG extract process to result in a final feature length $L_3$ of 144 nm is acceptable (i.e., does not violate design rules). This would result in a distance $D_3$ of 70 nm between live feature 16 and dummy feature 40. The amount of pullback depends on scanner resolution capability as well as details of the gate lithographic and etch processes. The amount of pullback allowed may vary and can range, for example, from about 70 nm to about 120 nm.

To implement the process, a software PG extract process can be used which scans the design database for instances where vertical GHOSTPOLY touches horizontal POLY. One method to detect vertical versus horizontal features is to perform a "shrink/grow" operation, where all features on a given layer are "shrunk" in a given direction by a value more than the standard gate CD, then grown back by the same amount. Features that are gates or dummy polysilicon at the minimum CD aligned in that direction will "shrink" to zero CD, and will therefore be deleted from the database. The features that remain are either larger or have the opposite orientation. Once all instances where vertical GHOSTPOLY touches horizontal POLY have been identified, each identified vertical GHOSTPOLY feature is modified by pulling back the edge which touches the horizontal POLY by a distance of 70 nm.

Figure 5:
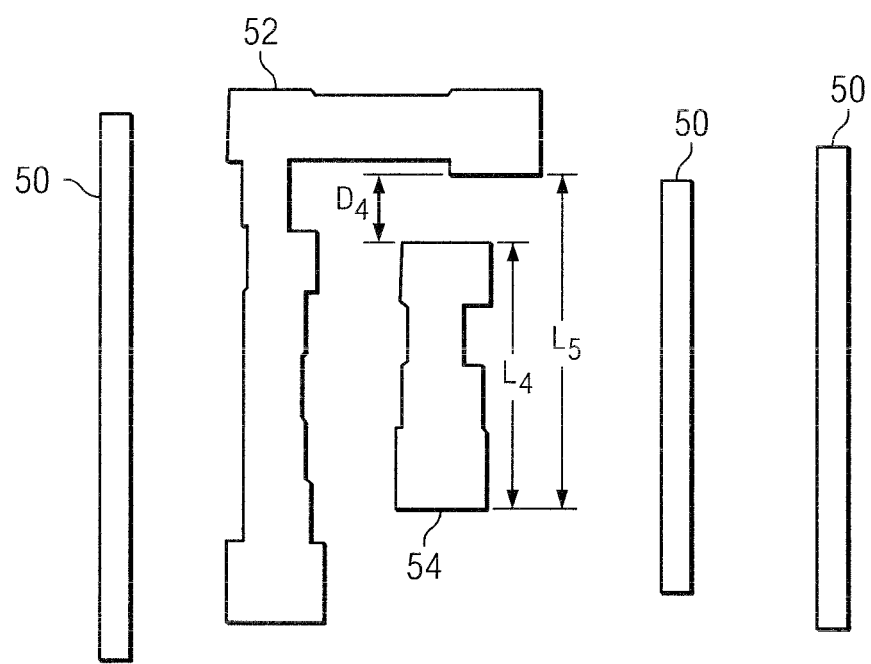
FIG. 5 is a plan view of a structure layout which can be formed using an embodiment of the present teachings.

FIG. 5 depicts a structure which can be formed in accordance with another embodiment of the present teachings. FIG. 5 depicts print-assist features 50 which are spaced from all other features by a distance. FIG. 5 further depicts live features 52, 54. In this embodiment, live feature 54 is to have a final length equal to $L_4$. However, specifying a length of $L_4$ for live feature 54 at a specific technology node would violate design rules. For example, a minimum allowable run length for feature 54 may be longer than $L_4$. As such, live feature 54 can be initially designed to have a length equal to $L_5$, which would result in electrical contact between feature 52 and 54 (i.e., a specified first distance between live feature 52 and live feature of 54 is equal to zero), thereby shorting the two live features together when they should be electrically isolated from each other.

After initially designing live feature 54 to have a length of $L_5$, the process described above can be performed on the live features in the layout to identify that physical contact is being made between live features 52 and 54. Once the live features have been identified, a PG extract process can be performed on the layout which pulls back live feature 54 away from live feature 52 by a value of 70 nm to result in live feature 54 having a final length of $L_4$, such that a distance $D_4$ between live feature 52 and live feature 54 is greater than zero. In this instance, because the upper portion of vertical feature 54 touches feature 52, the upper portion of vertical feature 54 is pulled back (i.e., shortened) by a value of 70 nm such that $D_4$ is equal to 70 nm.

In another embodiment, the designed features do not touch, but the distance between the features, for example, distance $D_1$ in FIG. 1, is less than a minimum allowable. For example, feature 12 in FIG. 1 is formed to have an allowable length. However, during design checking, it is determined that features 12 and 16 are formed too close to each other such that the $D_1$ is less than a minimum. Once distance $D_1$ is identified as violating a design rule, a PG extract process is performed which pulls back feature 12 away from feature 16 by 70 nm such that the distance between features 12 and 16 is 70 nm plus the original distance $D_1$.

For a process having a depth of focus (DOF) exposure latitude of 6%, post-PG extract run lengths for features having various CD's can be determined. For example, a feature having a CD of 180 nm would have a resulting post-PG extract feature of 138 nm. For a feature having a CD run length of 160 nm, a resulting post-PG extract feature can be 122 nm. Similarly, for a feature having a CD run length of 150 nm, a resulting post-PG extract feature length may be 111 nm. The minimum printable line-end gap is a function of the scanner numerical aperture (NA), the photoresist contrast, the print CD, the etch CD, etc., which can be determined, for example, using modeling software such as PROLITH® available from KLA-Tencor of San Jose, Calif.

Figure 6:
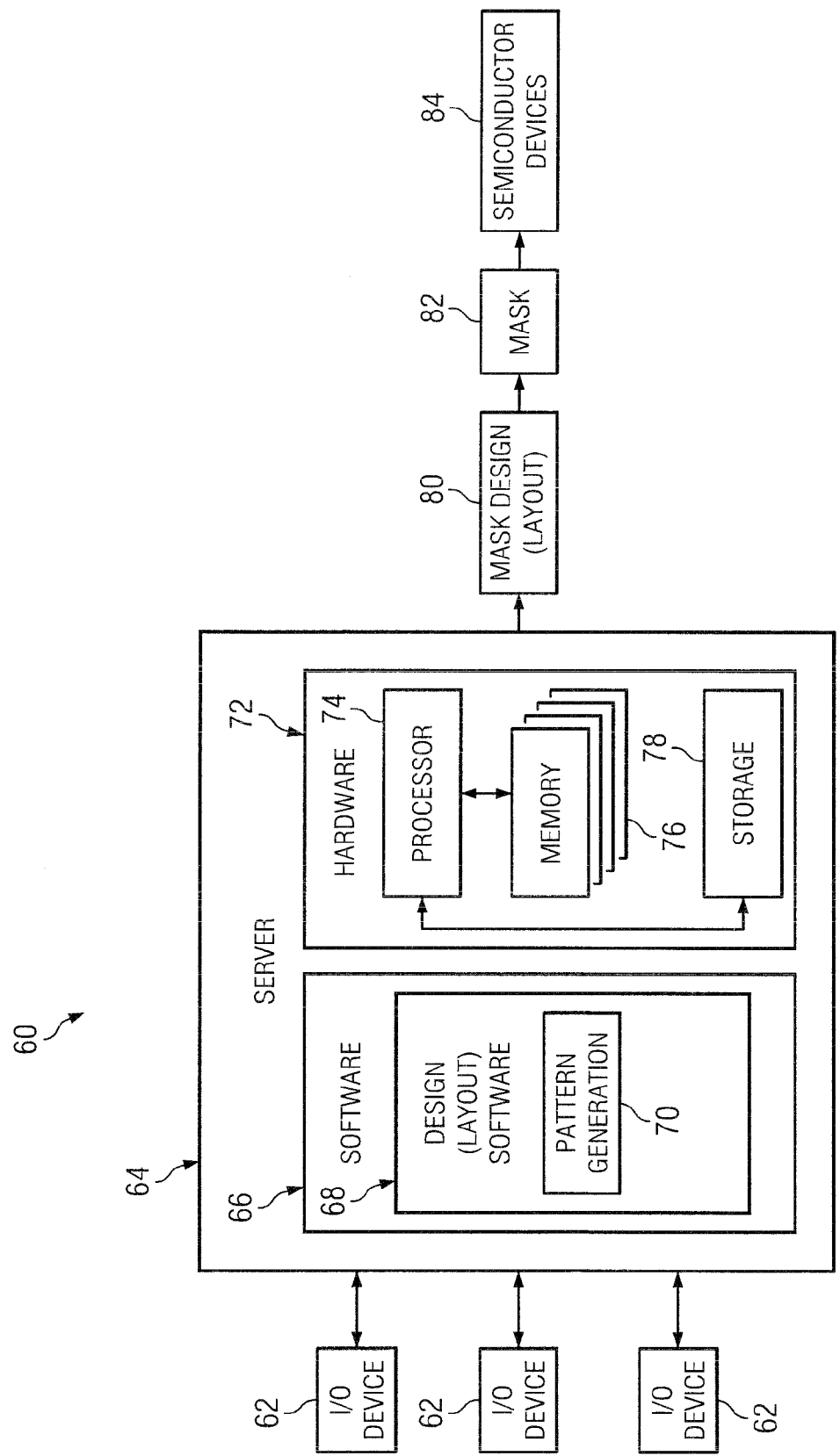
FIG. 6 is a computer system in accordance with an embodiment of the present teachings.

FIG. 6 is a block diagram depicting a system 60 in accordance with the present teachings which can be used to implement the processes and structures described above. The system 60 can be an electronic system, for example, a computer system, which implements a method to form a mask or set of masks which, in turn, are used to form a semiconductor device and systems including the semiconductor device.

The system 60 of FIG. 6 can include one or more input/output (I/O) devices 62, such as individual computers, computer workstations, networked computers, etc., which receive human input, for example, from an engineer, technician, or CAD layout designer. Each I/O device 62 communicates wirelessly, via a cable, etc. with a server 64, such as one or more computers, minicomputers, mainframes, etc. The server 64 can include software 66 to perform a set of instructions. For example, software 66 can include design (layout) software 68 such as EDA software. The EDA software can further include a pattern generation (PG) extract module 70 which is designed to perform a set of instructions which is adapted to perform (execute) the operations listed above with reference to FIGS. 1-5.

The server 64 can also include device hardware 72, such as one or more processors 74, such as a microprocessor. The server can further include, and the processor can communicate with, one or more memory devices 76 such as volatile and/or nonvolatile semiconductor devices, and other storage 78 such as one or more hard drives, flash drives, tape drives, or combinations thereof. In some instances, memory 76 and storage 78 may be a single combined unit. In other cases, storage 78, memory 76, and processor 74 may be a single combined unit.

The system 60 can be used to produce a mask design (layout) 80 in accordance with the processes above with reference to FIGS. 1-5. The mask design 80 can include a single mask design, or a design for a set of masks. The mask design 80 can then be used to produce a mask set 82 which can include at least one mask or a plurality of masks. The mask set can include one or more reticles, phase-shift masks, attenuated phase shift masks, etc. Subsequently, the mask set can be used to produce one or more semiconductor devices 84.

It is therefore contemplated that for advanced technology nodes, use of dummy features, for example, dummy polysilicon features adjacent to end gates in gate arrays, is desirable or required to achieve adequate CD uniformity. In general, these dummy features should be electrically isolated (i.e., disconnected) from "live" features such as live polysilicon features to avoid unwanted electrical issues such as parasitic capacitance and gate oxide instability. For 28 nm and smaller technology nodes, the minimum printable run length for dummy polysilicon can be larger than the minimum width for the technology node. This can lead to problems in layout, especially in the design of structures where a feature turn is required near an active region edge, for example, because of elevation differences in the topography at the location. Embodiments of the present teachings can include a use for the formation of line-end geometry using line-end pullback. For purposes of this disclosure, line-end geometry includes a line segment which has a width which is less than two times the minimum allowed feature width, and which has two external corners. It has been determined that line-end pullback is reduced if the line end is supported by (i.e., in proximity, in close proximity, or electricity contacting) another device feature, for example, a crossing feature. The dummy polysilicon feature can be drawn to be electrically connected to (i.e., electrically coupled with) the crossing field polysilicon with a longer run length, and then "disconnected" with a PG extract. Equivalently, one can require a much shorter run length for features with line ends within some proximity of crossing polysilicon.

It should be noted that during the design phase, the "structures" are polygon design structures only and are not physical structures formed from an actual material. For example, the dummy feature layout contacts the crossing feature in design only, then the design is altered such that dummy feature is pulled back and therefore disconnected from the crossing feature design. Once the mask is completed, the actual physical structure is formed such that the dummy feature does not electrically contact the crossing feature, but can still have a run length which would be identified by EDA rule checking as being shorter than a minimum printable run length if the length was specified directly. The PG extract process can result in a shorter dummy feature which has a length which is shorter than can be specified directly by design rules, but which passes rule checking.

Certain embodiments may be implemented or executed in the form of a computer program or software. The computer program or software may exist in a variety of forms, including in long-term storage, in execution by a computer system, and others. For example, the computer program can exist as software program(s) comprising program instructions in source code, object code, executable code or other formats; firmware program(s); or hardware description language (HDL) files. Any of the forgoing can be embodied on a computer readable medium, which can include storage devices, electronic memory, and signals, in compressed or uncompressed form. Exemplary computer readable storage devices or media include conventional computer system RAM (random access memory), ROM (read-only memory), EPROM (erasable, programmable ROM), EEPROM (electrically erasable, programmable ROM), magnetic disks or optical disks, solid-state disks, or magnetic storage tapes. Computer programs or software can be distributed or accessed for instance via hard disk, solid state storage devices, CD-ROM, or via Internet download. In respects, the Internet itself, as an entity, can be regarded a computer readable medium, as can local area networks (LANs) and other computer networks in general.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. =1, −2, −3, −10, −20, −30, etc.

While the present teachings have been illustrated with respect to one or more implementations, alterations and/or modifications can be made to the illustrated examples without departing from the spirit and scope of the appended claims. In addition, while a particular feature of the disclosure may have been described with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:
1. A method for designing a lithography mask set, comprising:
   providing a device circuit layout including a first polygon portion having a first orientation and a second polygon portion having a second orientation perpendicular to the first orientation, wherein the second polygon portion forms a line-end geometry;

specifying that a separation between the first polygon portion and the second polygon portion is a first distance;

specifying that a separation between the second polygon portion and all other polygons in the device circuit layout is at least a second distance that is larger than the first distance;

specifying a first length for the second polygon portion; and reducing the length of the second polygon portion from the first length to a second length which is less than the first length, wherein the second length is based on the second feature's proximity to the first feature.

2. The method of claim 1, further comprising:

providing a third polygon portion having the second orientation and separated from all other polygons in the device circuit layout by a third distance that is larger than the first distance; and specifying that the third polygon portion has a third length that is at least as long as the first length.

3. The method of claim 2, further comprising:

specifying that the first distance is equal to zero such that the first length results in electrical contact between the second polygon portion and the first polygon portion;

specifying that the third distance is at least as large as the second distance; and subsequent to specifying that the third polygon portion has the third length, performing a pattern generation (PG) extract process on the device circuit layout such that, subsequent to performing the PG extract process, the second polygon portion has the second length which is less than both the first length and the third length and the second polygon portion is spaced from first polygon portion by a distance greater than zero.

4. The method of claim 1, further comprising:

specifying that the first distance is less than or equal to 0.9 times the second distance.

5. The method of claim 1, further comprising:

specifying that the second length is less than or equal to 0.7 times the first length.

6. A computer-readable medium storing a set of instructions which causes a computer system to perform a set of instructions to execute a method comprising:

providing a device circuit layout including a first polygon portion having a first orientation and a second polygon portion having a second orientation perpendicular to the first orientation, wherein the second polygon portion forms a line-end geometry;

specifying that a separation between the first polygon portion and the second polygon portion is equal to a first distance;

specifying that a separation between the second polygon portion and all other polygons in the device circuit layout is at least a second distance that is larger than the first distance;

specifying a first length for the second polygon portion; and reducing the length of the second polygon portion from the first length to a second length which is less than the first length, wherein the second length is based on the second feature's proximity to the first feature.

7. The computer-readable medium storing the set of instructions of claim 6, wherein the set of instructions further causes a computer system to perform a set of instructions to execute a method further comprising:

providing a third polygon portion having the second orientation and separated from all other polygons in the device circuit layout by a third distance that is larger than the first distance; and specifying that the third polygon has a third length that is at least as long as the first length.

* * * * *